(12) United States Patent
Choi (10) Patent No.: US 9,349,575 B2
(45) Date of Patent: May 24, 2016

(54) REMOTE PLASMA SYSTEM HAVING SELF-MANAGEMENT FUNCTION AND SELF MANAGEMENT METHOD OF THE SAME

(71) Applicant: Dai Kyu Choi, Gyeonggi-do (KR)

(72) Inventor: Dai Kyu Choi, Gyeonggi-do (KR)

(73) Assignee: Dai Kyu Choi, Gyeonggi-do (KR)

( * ) Notice: Subject to any disclaimer, the term of this patent is extended or adjusted under 35 U.S.C. 154(b) by 147 days.

(21) Appl. No.: 14/011,197

(22) Filed: Aug. 27, 2013

(65) Prior Publication Data

US 2014/0346952 A1 Nov. 27, 2014

(30) Foreign Application Priority Data

May 22, 2013 (KR) .................. 10-2013-0057759

(51) Int. Cl.
*H01J 7/24* (2006.01)
*H01J 37/32* (2006.01)
*H05H 1/46* (2006.01)

(52) U.S. Cl.
CPC ....... *H01J 37/32935* (2013.01); *H01J 37/3299* (2013.01); *H01J 37/32357* (2013.01); *H01J 37/32917* (2013.01); *H05H 1/46* (2013.01); *H05H 2001/463* (2013.01)

(58) Field of Classification Search
CPC .................................................. H01J 37/32935
See application file for complete search history.

(56) References Cited

U.S. PATENT DOCUMENTS

| | | | | |
|---|---|---|---|---|
| 5,006,828 A * | 4/1991 | Yutaka | ............... | G01N 27/12 338/34 |
| 5,531,834 A * | 7/1996 | Ishizuka | ............... | C23C 16/509 118/723 E |
| 5,669,975 A * | 9/1997 | Ashtiani | ............... | C23C 16/507 118/723 I |
| 5,683,539 A * | 11/1997 | Qian | ............... | H01J 37/32174 118/723 IR |
| 6,252,354 B1 * | 6/2001 | Collins | ............... | H01J 37/321 118/723 I |
| 6,494,986 B1 * | 12/2002 | Hanawa | ............... | H01J 37/32082 118/723 AN |
| 6,762,393 B2 * | 7/2004 | Choi | ............... | H05H 1/46 156/345.48 |
| 6,781,317 B1 * | 8/2004 | Goodman | ............... | H01J 37/32935 315/111.21 |
| 6,824,363 B2 * | 11/2004 | Mitrovic | ............... | F04B 17/00 417/48 |
| 6,838,832 B1 * | 1/2005 | Howald | ............... | H01J 37/32082 315/111.21 |
| 6,887,339 B1 * | 5/2005 | Goodman | ............... | H01J 37/32082 118/723 E |
| 6,899,527 B2 * | 5/2005 | Quon | ............... | H01J 27/143 118/715 |
| 6,920,312 B1 * | 7/2005 | Benjamin | ............... | H01J 37/32082 330/149 |
| 6,939,434 B2 * | 9/2005 | Collins | ............... | H01J 37/32082 118/723 ER |
| 7,037,813 B2 * | 5/2006 | Collins | ............... | H01J 37/32082 438/151 |
| 7,096,819 B2 * | 8/2006 | Chen | ............... | H01J 37/32174 118/723 I |
| 7,137,354 B2 * | 11/2006 | Collins | ............... | H01J 37/321 118/723 I |
| 7,285,916 B2 * | 10/2007 | Wi | ............... | H01J 37/32009 118/719 |
| 7,320,734 B2 * | 1/2008 | Collins | ............... | H01J 37/321 118/726 |
| 7,969,096 B2 * | 6/2011 | Chen | ............... | H01J 37/321 315/111.21 |
| 8,058,156 B2 * | 11/2011 | Hanawa | ............... | C23C 14/046 257/E21.057 |

(Continued)

*Primary Examiner* — Douglas W Owens
*Assistant Examiner* — Srinivas Sathiraju
(74) *Attorney, Agent, or Firm* — IP & T Group LLP (57) ABSTRACT

A remote plasma system having a self-management function measures an operating state of a remote plasma generator while a remote plasma generator operates, which generates plasma and remotely supplies the generated plasma to a process chamber, thereby allowing a process manager to check the measured operating state and performing a required process control depending on an operating state. According to the remote plasma system having the self-management function, it is possible to check operating state information of the remote plasma generator and plasma treatment process progress state information in the process chamber in real time so as to determine whether the remote plasma generator normally operates and immediately sense occurrence of an error during the operation.

15 Claims, 5 Drawing Sheets

(56) References Cited

U.S. PATENT DOCUMENTS

| | | | |
|---|---|---|---|
| 8,409,400 B2* | 4/2013 | Wi | H01J 37/321 118/723 I |
| 8,853,948 B2* | 10/2014 | Choi | H05H 1/46 315/111.21 |
| 8,944,003 B2* | 2/2015 | Chen | H01L 21/02263 118/723 E |
| 9,035,553 B2* | 5/2015 | Choi | H01J 37/32816 156/345.38 |
| 2002/0067133 A1* | 6/2002 | Brown | H01J 37/32009 315/111.51 |
| 2003/0213559 A1* | 11/2003 | Goodman | H01J 37/32082 156/345.28 |
| 2004/0104681 A1* | 6/2004 | Mitrovic | G01N 15/0227 315/111.21 |
| 2009/0291027 A1* | 11/2009 | Choi | H05H 1/46 422/105 |
| 2013/0154480 A1* | 6/2013 | Choi | H05H 1/46 315/111.51 |
| 2013/0171038 A1* | 7/2013 | Choi | B01J 19/12 422/186.03 |
| 2013/0175928 A1* | 7/2013 | Choi | H05H 1/46 315/111.41 |
| 2013/0307414 A1* | 11/2013 | Choi | 315/111.51 |

\* cited by examiner

REMOTE PLASMA SYSTEM HAVING SELF-MANAGEMENT FUNCTION AND SELF MANAGEMENT METHOD OF THE SAME

CROSS-REFERENCE TO RELATED APPLICATIONS

This application claims priority to and the benefit of Korean Patent Application No. 10-2013-0057759 filed in the Korean Intellectual Property Office on May 22, 2013, the entire contents of which are incorporated herein by reference.

TECHNICAL FIELD

The present invention relates to a plasma processing system, and particularly, to a remote plasma system that performs a plasma treatment process in a process chamber by remotely receiving plasma generated through a remote plasma generator.

BACKGROUND ART

Plasma discharge is used in gas excitation for generating active gas containing ions, free radicals, atoms, and molecules. The active gas is widely used in various fields and representatively variously used in a semiconductor manufacturing process, for example, etching, deposition, washing, ashing, and the like.

A remote plasma generator is a device that generates plasma outside a process chamber to remotely supply the generated plasma to the process chamber. A representative semiconductor manufacturing process using the remote plasma generator includes, for example, a washing process for washing the inside of the process chamber and an ashing process for removing a photoresist film deposited on a substrate to be treated. In addition, the remote plasma generator is used even in various other semiconductor manufacturing processes.

In the semiconductor manufacturing process, maintenance efficiency of process equipment is one of the very important elements in terms of productivity and cost. In general, in the case of maintenance of the process equipment, an equipment use time when the equipment normally operates is calculated in advance to periodically maintain the equipment after using the equipment for a predetermined time. Even in the case of the remote plasma generator, after the remote plasma generator is used for a predetermined time, maintenance such as replacement of a time-worn part or replacement of the equipment itself is required. The maintenance may be required even for another reason. For example, after a substrate treatment process is completed, when a problem occurs in a treatment result thereof, it may be recognized that the maintenance of the equipment is required.

However, when the necessity of the maintenance of the equipment is recognized by sensing a treatment error, unnecessary production cost may be generated with deterioration in productivity. Further, if the equipment is normally usable even when the equipment is periodically maintained after being used for a predetermined time, unnecessary cost may be generated. Therefore, most preferably, a maintenance time of the equipment is, in advance, predicted by determining an operating state of the equipment in real time to cope with the problem before the problem occurs in the process.

While the plasma generated from the remote plasma generator is supplied to the process chamber to perform the plasma treatment process, appropriate monitoring of the operating state of the remote plasma generator and the plasma treatment process is required. However, since the remote plasma generator so far may not provide appropriate information on an equipment state and a process progress state, it is very difficult to execute the maintenance at an appropriate time. Therefore, it is necessary that a process manager can immediately cope with problems, which occur while the process is in progress, by monitoring the operating state of the remote plasma generator and the plasma treatment process in real time and sensing the problems in real time while the remote plasma generator is connection with the process chamber and operates.

SUMMARY OF THE INVENTION

The present invention has been made in an effort to provide a remote plasma system having a self management function and a self management method of the same that can check operating state information of a remote plasma generator in real time to judge whether the remote plasma generator normally operates and immediately sense occurrence of an error during an operation.

The present invention has also been made in an effort to provide a remote plasma system having a self management function and a self management method of the same that can check operating state information of a remote plasma generator and plasma treatment process progress state information in a process chamber in real time while plasma generated from the remote plasma generator is supplied to the process chamber.

An exemplary embodiment of the present invention provides a remote plasma system having a self management function. The remote plasma system includes: a remote plasma generator generating plasma and remotely supplying the generated plasma to a process chamber; a sensor unit including one or more voltage measurement sensors for measuring voltage induced to a generator body of the remote plasma generator; and a control unit generating operating state information of the remote plasma generator based on voltage values measured by the one or more voltage measurement sensors.

The sensor unit may include one or more current measurement sensors measuring current which leaks through the generator body of the remote plasma generator, and the control unit may generate another operating state information based on a leakage current measurement value measured by the current measurement sensor.

The sensor unit may include a current transformer installed around a gas outlet of the remote plasma generator, and the control unit may generate another operating state information based on a current measurement value measured through the current transformer.

The sensor unit may include a plasma measurement sensor measuring plasma generated in the generator body of the remote plasma generator, and the control unit may generate another operating state information of the remote plasma generator based on a plasma measurement value measured through the plasma measurement sensor.

The sensor unit may include a plasma measurement sensor measuring a state of plasma that flows into the process chamber, and the control unit may generate process progress state information in the process chamber based on a plasma measurement value measured by the plasma measurement sensor.

The sensor unit may include a plasma measurement sensor measuring a plasma, state of exhaust gas which is exhausted from the process chamber, and the control unit may generate process progress state information in the process chamber based on a plasma, measurement value measured, by the plasma measurement sensor.

The remote plasma generator may include: a generator body having a plasma discharge space; a transformer having a magnetic core and a primary wire wound to the magnetic core which are installed in the generator body so as to supply electromotive force for forming plasma to the plasma discharge space of the generator body; and a power supply source supplying driving power to the primary wire of the transformer.

The remote plasma system may further include a capacitively coupled electrode that is installed in the generator body so as to supply the electromotive force for forming the plasma to the plasma discharge space of the generator body and operates by receiving the driving power from the power supply source.

The remote plasma system may further include an induction antenna coil that is installed in the generator body so as to supply the electromotive force for forming the plasma to the plasma discharge space of the generator body and operates by receiving the driving power from the power supply source.

The remote plasma generator may include a metallic generator body having two or more divided regions divided into one or more insulation sections, and the voltage measurement sensor may include two or more voltage measurement sensors installed in each of the two or more divided regions of the generator body.

The remote plasma generator may include a metallic generator body having the plasma discharge space and two or more divided regions divided into one or more insulation sections, and the current measurement sensor may include two or more current measurement sensors installed in the two or more divided regions of the generator body.

Another exemplary embodiment of the present invention provides a self management method of a remote plasma system having a self management function. The self management method of the remote plasma system includes: starting an operation of a remote plasma generator; measuring voltage induced to a generator body of the remote plasma generator through a sensor unit including one or more voltage measurement sensors; and generating operating state information of the remote plasma generator based on a voltage measurement value induced to the generator body of the remote plasma generator, which is measured by the sensor unit.

The self management method may further include, wherein the sensor unit includes a current measurement sensor measuring current which leaks through the generator body of the remote plasma generator, generating another operating state information based on a leakage current measurement value measured by the current measurement sensor.

The self management method may further include, wherein the sensor unit includes a current transformer installed around a gas outlet of the remote plasma generator, generating another operating state information based on a measurement value measured by the current transformer.

The self management method may further include, wherein the sensor unit includes a plasma measurement sensor measuring plasma generated in the generator body of the remote plasma generator, generating another operating state information based on a plasma measurement value measured by the plasma measurement sensor.

The self management method may further include, wherein the sensor unit includes a plasma measurement sensor measuring a plasma state in the process chamber, generating process progress state information in the process chamber based on a plasma measurement value measured by the plasma measurement sensor.

The self management method may further include, wherein the sensor unit includes a plasma measurement sensor measuring a plasma state of exhaust gas which is exhausted from the process chamber, generating process progress state information in the process chamber based on a plasma measurement value measured by the plasma measurement sensor.

According to a remote plasma system having a self management function and a self management method of the same of the present invention, it is possible to check operating state information of a remote plasma generator in real time to judge whether the remote plasma generator normally operates and immediately sense occurrence of an error during the operation. Further, it is possible to check in real time operating state information of the remote plasma generator and plasma treatment process progress state information in a process chamber while the plasma generated from the remote plasma generator is supplied to the process chamber.

Therefore, a process manager can determine an operating state of the remote plasma system in real time and immediately cope with an abnormal operation when the abnormal operation occurs. Further, the process manager can determine the system in real time at the time when maintenance of the system is required, thereby increasing maintenance efficiency.

DETAILED DESCRIPTION

Exemplary embodiments of the present invention will be described with reference to the accompanying drawings in order to sufficiently understand the present invention. The exemplary embodiments of the present invention can be modified in various forms, and it should not be construed that the scope of the present invention is limited to exemplary embodiments described below in detail. The exemplary embodiments are provided to more completely describe the present invention to those skilled in the art. Therefore, shapes of elements in the drawings may be enlarged in order to emphasize a more clear description. It is noted that like reference numerals refer to like elements in each drawing. A detailed description of known functions and configurations lodged to unnecessarily obscure the spirit of the present invention will be omitted.

Figure 1:
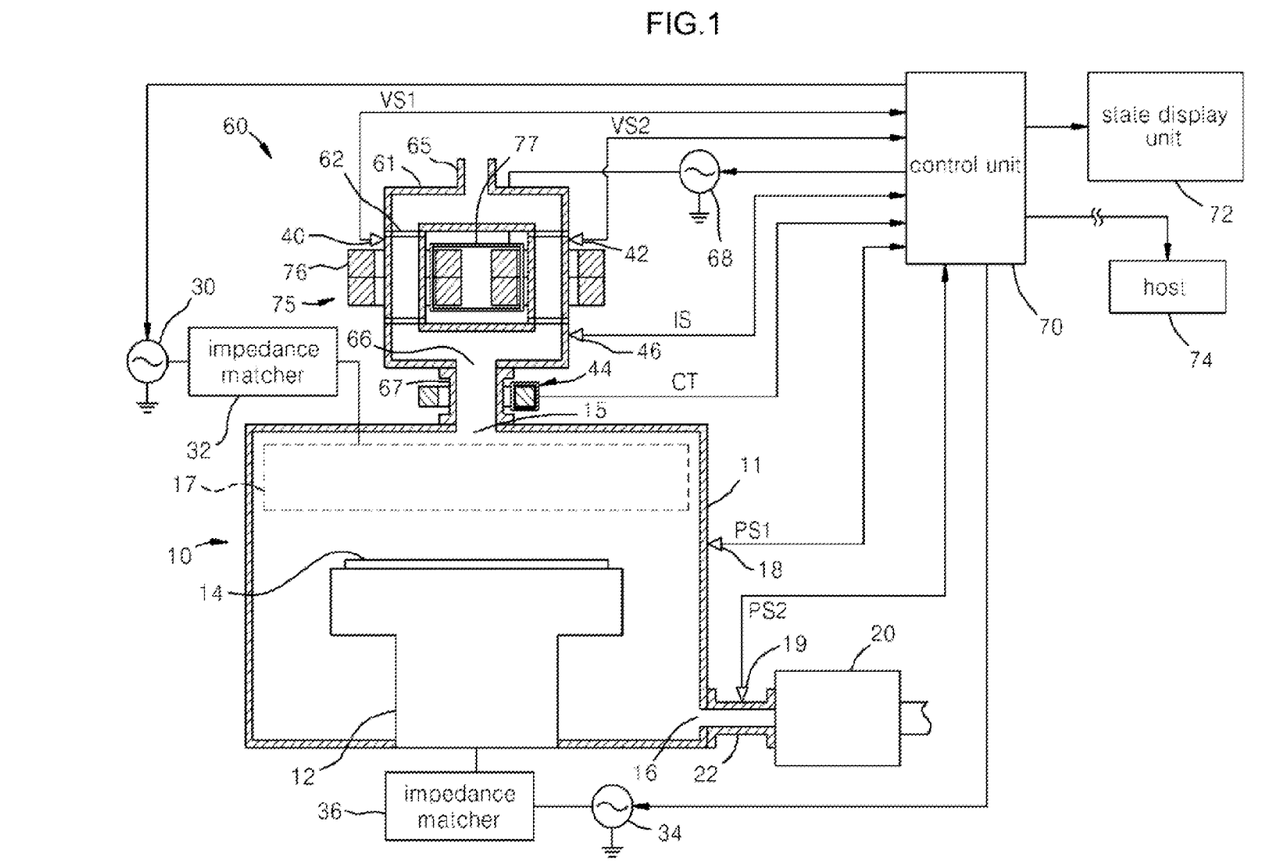
FIG. 1 is a diagram illustrating an overall configuration of a remote plasma system having a self management function according to an exemplary embodiment of the present invention.

FIG. 1 is a diagram illustrating an overall configuration of a remote plasma system having a self management function according to an exemplary embodiment of the present invention.

Referring to FIG. 1, in the remote plasma system according to the exemplary embodiment of the present invention, while plasma generated from a remote plasma generator 60 is supplied to a process chamber 10, a predetermined plasma treatment process is performed in the process chamber 10. The process chamber 10 may be any one of the equipment for performing various plasma treatment processes such as etching, deposition, ashing, or surface modification for forming a thin film on a substrate 14 to be treated. The remote plasma generator 60 is used to perform not only the plasma treatment process for the substrate 14 to be treated but also the plasma treatment process for internal washing of the process chamber 10. The remote plasma system of the present invention has a self management function to immediately sense whether the remote plasma generator 60 normally operates, whether an error occurs during the operation, and the necessity of maintenance by measuring the operating state of the remote plasma generator 60 and the state of the plasma generated from the remote plasma generator 60 while the plasma treatment process is performed in real time.

The process chamber 10 includes a process chamber housing 11 and a substrate supporter 12 in which the substrate 14 to be treated is placed. The substrate 14 to be treated may be, for example, various types of wafer substrates or glass substrates for manufacturing a semiconductor device. A gas inlet 15 of the process chamber 10 is connected to a gas outlet 66 of the remote plasma generator 60 through an adapter 67. A gas exhaust port 16 provided at a lower portion of the process chamber 10 is connected to a vacuum pump 20 through an exhaust pipe 22. Although not illustrated in the figure in detail, the process chamber 10 may include a plasma source 17 for generating plasma therein, and a power supply source 30 and an impedance matcher 32 for the plasma source 17. The plasma generated from the remote plasma generator 60 is supplied to the inside of the process chamber housing 11 through the adapter 67, and as a result, a predetermined plasma treatment process is performed. The plasma supplied from the remote plasma generator 60 may be evenly distributed to the process chamber 10 through a baffle (not illustrated) provided in the process chamber 10. The substrate supporter 12 on which the substrate 14 to be treated is placed may be connected to a bias power supply source 34 through an impedance matcher 36.

For the remote plasma generator 60, various plasma generation types may be used, and in the exemplary embodiment, a transformer coupled plasma generation type remote plasma generator 60 is exemplified, but the present invention is not limited thereto. The remote plasma generator 60 includes a generator body 61 having a toroidal shape plasma discharge space. A transformer 75 having a magnetic core 76 and a primary wire 77 wound thereto so as to supply electromotive force for forming the plasma in the plasma discharge space is mounted on the generator body 61. The primary wire 7 is connected to a power supply source 68. The power supply source 68 includes a semiconductor switching circuit and generates radio-frequency power therethrough to supply the radio-frequency power to the primary wire 77. The power supply source 68 may include a control circuit for impedance matching or may supply the radio-frequency power to the primary wire 77 through an additional impedance matcher.

The power supply source 68 and the generator body 61 may be integrally configured or may be separated from each other. When gas flows into the gas inlet 65 provided in the generator body 61 and the radio-frequency power is supplied from the power supply source 68 to the primary wire 77 to drive the primary wire 77, the plasma is generated in the plasma discharge space inside the generator body 61. Plasma gas generated as described above is supplied to the process chamber 10 through the adapter 67.

The remote plasma system of the present invention includes a sensor unit constituted by a plurality of sensors for measuring an operating state of the remote plasma generator 60 and a control unit 70 generating operating state information of the remote plasma generator 60 based on an electric characteristic value measured by the sensor unit. The sensor unit includes one or more voltage measurement sensors 40 and 42 that measure voltage induced to the generator body 61. The voltage measurement sensors 40 and 42 measures the voltage induced to the generator body 61 while the remote plasma generator 60 operates and supplies the measurement voltage to the control unit 70. The sensor unit may further include one or more current measurement sensors 44. The voltage measurement sensor 44 measures current that flows on the generator body 61 which may be generated while the remote plasma generator 60 operates and supplies the measured current to the control unit 70. The sensor unit may further include a current transformer 44. The current transformer 44 is installed around the gas outlet 66 of the remote plasma generator 60 (for example, so that a core of the current transformer 44 surrounds the adapter 67).

Figure 2:
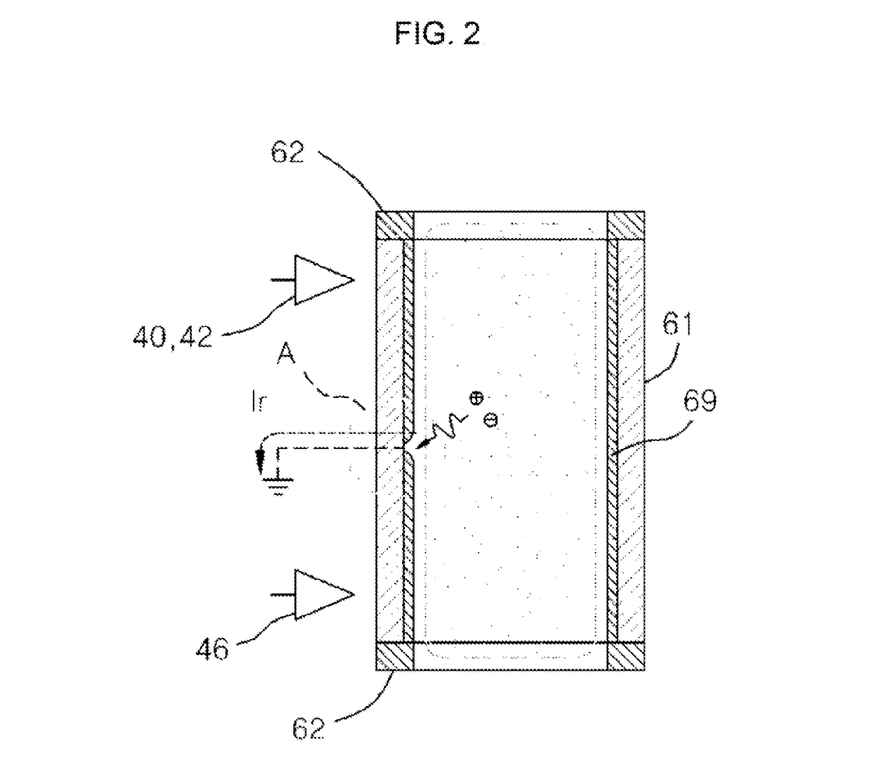
FIG. 2 is a cross-sectional view partially illustrating a generator body of the remote plasma generator.
Figure 3:
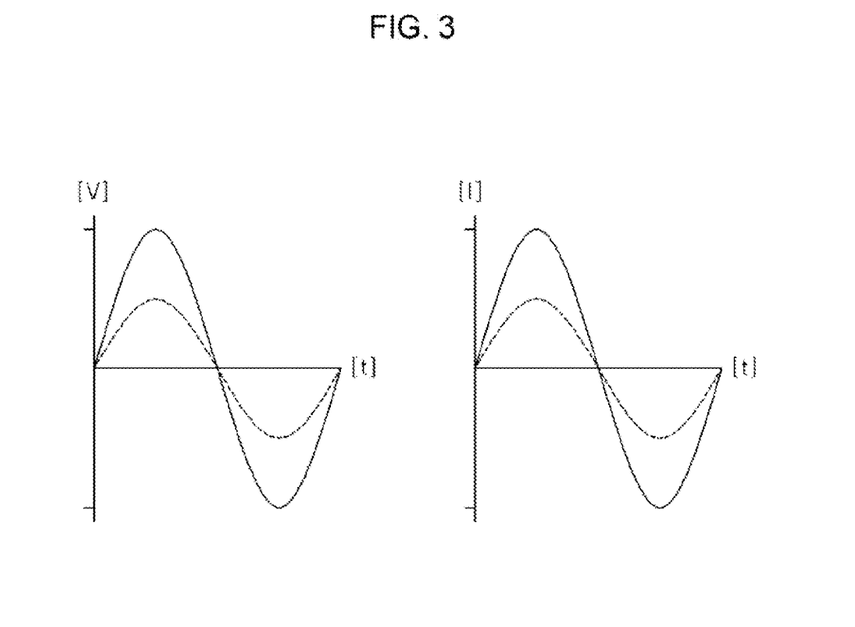
FIG. 3 is a voltage and current waveform diagram exemplarily illustrating normal values and abnormal values of voltage and current measured in the generator body of the remote plasma generator which are compared with each other.

FIG. 2 is a cross-sectional view partially illustrating the generator body of the remote plasma generator, and FIG. 3 is a voltage and current waveform diagram exemplarily illustrating normal values and abnormal values of voltage and current measured in the generator body of the remote plasma generator which are compared with each other.

Referring to FIGS. 2 and 3, the voltage and the current measured by the voltage measurement sensors 40 and 42, and the current measurement sensor 46 installed in the generator body 61 are measured differently from each other in a normal state (dotted-line mark) and an abnormal state (solid-line mark) as illustrated by the voltage and current waveform diagram in FIG. 3. A cause of when the abnormal state occurs may be diversified and may include, for example, a case in which initial ignition fails, a case in which plasma is off, a case in which a plasma state is unstable, a case in which an internal protection film 69 of the generator body 61 is damaged, a case in which arc is generated inside the generator body 61, a case in which power supplying is unstable, and the like.

When the remote plasma generator 60 starts an operation, the electromotive force for generating plasma is transferred to the inside of the generator body 61 and voltage is induced even to the generator body 61 while plasma is generated. When the remote plasma generator 60 is in a normal state, the voltage induced to the generator body 61 is detected in a normal form. However, when the remote plasma generator 60 is in an abnormal state by a predetermined cause, the voltage induced to the generator body 61 is measured in an abnormal form.

For example, when the arc is generated inside the generator body 61, the voltage measured in the generator body 61 is measured in the abnormal form. When the internal protection film 69 of the generator body 61 is damaged (marked by a dotted-line circle 'A' in FIG. 2), leakage current may be generated through the generator body 61. The leakage current may be detected by the current measurement sensor 46. Further, even when the leakage current is generated, the voltage induced to the generator body 61 may fluctuate. Since the inside of the generator body 61 is damaged by an impact of plasma ion particles, the remote plasma generator 60 has a reduced life-span. The leakage current is measured by the current measurement sensor 46 to diagnose the life-span of the generator body 61.

The current transformer 44 is installed in the adapter 67 and measures a change in current while the plasma gas is supplied to the process chamber 10, so as to provide the measurement value to the control unit 70. The current transformer 44 provides a normal current measurement value while normal plasma gas is supplied to the process chamber 10 from the remote plasma generator 60, but provides an abnormal current measurement value when the plasma gas is abnormally supplied.

The control unit 70 generates the operating state information of the remote plasma generator 60 based on one or more values of the measurement values provided from the voltage measurement sensors 40 and 42, the current measurement sensors 44 and 46, and the current transformer 44 that constitute the sensor unit. The generated operating state information of the remote plasma generator 60 may be displayed through a state display unit 72 or provided to a host 74 that controls and manages the whole system. The state display unit 72 may include a display device for displaying a screen and a speaker device for displaying a voice. Further, the control unit 70 may control an overall operation of the remote plasma system as necessary, and warn an operator of the necessity for maintenance through the state display unit 72 or perform a control required for an overall operation of the system, when an error occurs during the operation. For example, the control unit 70 may stop the operation of the system by stopping operations of various power supply sources 30, 34, and 68 in case of emergency.

Although not illustrated in the figure, the sensor unit may include a plasma measurement sensor for optically or electrically measuring the plasma generated by the remote plasma generator 60. The plasma measurement sensor is installed in the generator body 61 or the adapter 67 to measure a state of the plasma generated by the remote plasma generator 60 and provide the measured state to the control unit 70 while the remote plasma generator 60 operates. The control unit 70 generates another operating state information of the remote plasma generator 60 and performs a state display and a required control through the state display unit 72, based on the plasma measurement value measured through the plasma measurement sensor.

The sensor unit may include other plasma measurement sensors 18 and 19 for optically or electrically measuring the plasma in the process chamber 10 while the plasma is treated in the process chamber 10. For example, the sensor unit may include the plasma measurement sensor 18 for measuring an internal plasma state of the process chamber 10 and the plasma measurement sensor 19 for measuring a state of plasma which is exhausted from the process chamber 10. The control unit 70 generates process progress state information in the process chamber 10 based on the plasma measurement values measured through the plasma measurement sensors 18 and 19 to display the generated process progress state information through the state display unit 72 and perform a required control. For example, a process progress state and a process completion state or an error state may be judged by measuring a process decomposition rate by plasma.

Figure 4:
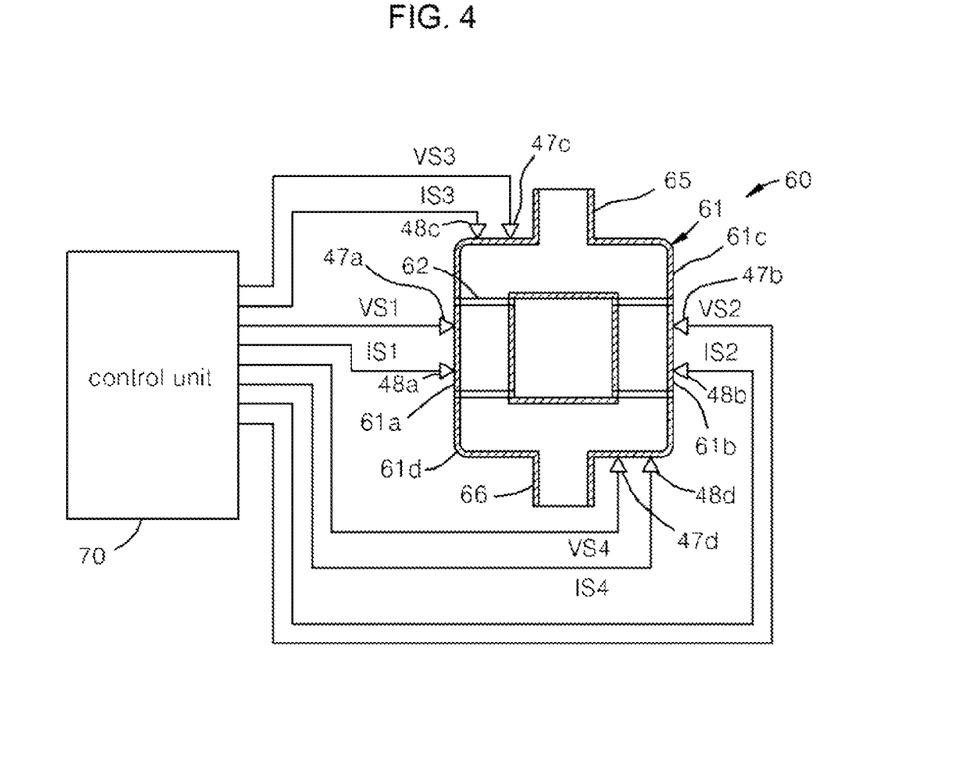
FIG. 4 is a diagram exemplarily illustrating a case in which voltage and current are measured in respective regions when the generator body of the remote plasma generator is divided into a plurality of insulation sections.
Figure 5:
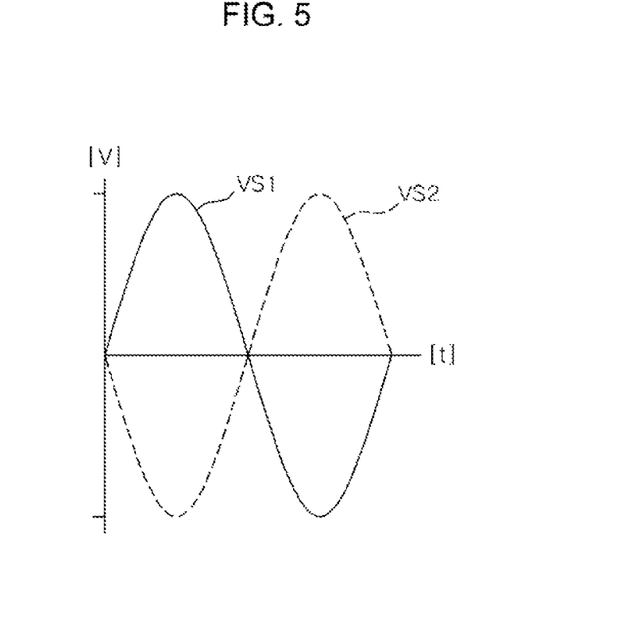
FIG. 5 is a voltage waveform diagram exemplarily illustrating voltage measured in different parts of the generator body of the remote plasma generator.

FIG. 4 is a diagram exemplarily illustrating a case in which voltage and current are measured in respective regions when the generator body of the remote plasma generator is divided into a plurality of insulation sections, and FIG. 5 is a voltage waveform diagram exemplarily illustrating voltage measured in different parts of the generator body of the remote plasma generator.

Referring to FIG. 4, the generator body 61 of the remote plasma generator 60 is made of metallic materials such as aluminum, stainless steel, and copper. Alternatively, the generator body 61 may be made of coated metal such as anodized aluminum or nickel plated aluminum. Alternatively, the generator body 61 may be made of refractory metal. As another alternative, the generator body 61 may be made of insulation materials such as quartz and ceramic and even other materials suitable to perform an intended plasma process. The generator body 61 includes one or more electrical insulation regions 62, which provides electrical discontinuity, in order to prevent eddy current from being generated when the generator body 61 includes the metallic materials. The insulation region 62 is made of electrical insulation materials such as quartz and ceramic.

When the primary wire 77 of the transformer 75 is driven, plasma is ignited while the induction electromotive force is transferred to the plasma discharge space of the generator body 61, and as a result, plasma is generated in the generator body 61. Voltage depending on the operation of the remote plasma generator 60 is induced to the generator body 61 while the remote plasma generator 60 operates. However, when the generator body 61 is divided into a plurality of parts by one or more insulation regions 62, voltages induced in the respective divided regions are different from each other.

For example, as illustrated in FIG. 4, when the generator body 61 including the four insulation regions 62 is divided into four regions 61a, 61b, 61c, and 61d, voltage measurement sensors 47a, 47b, 47c, and 47d and current measurement sensors 48a, 48b, 48c, and 48d may be installed in the respective regions. A voltage waveform VS1 detected by the first voltage measurement sensor 47a installed in the first region 61a and a voltage waveform VS2 detected by the second voltage measurement sensor 47b installed in the second region 61b may have phases inverse to each other.

The voltage and the current measured by the voltage measurement sensors 47a, 47b, 47c, and 47d and the current measurement sensors 48a, 48b, 48c, and 48d installed in the first to four regions 61a, 61b, 61c, and 61d are detected as a predetermined phase difference and a predetermined size with which the remote plasma generator 60 normally operates. However, when an error occurs in the remote plasma generator 60, the voltage or current measured by the voltage measurement sensors 47a, 47b, 47c, and 47d and the current measurement sensors 48a, 48b, 48c, and 48d varies in phase difference or size measured in the normal state. The control unit 70 judges whether the remote plasma generator 60 normally operates, based on the variation component, displays the operating state through the state display unit 70, and performs the required control.

FIGS. 6 to 9 are diagrams exemplarily illustrating various types of remote plasma generators which may be adopted in the remote plasma system of the present invention.

Figure 6:
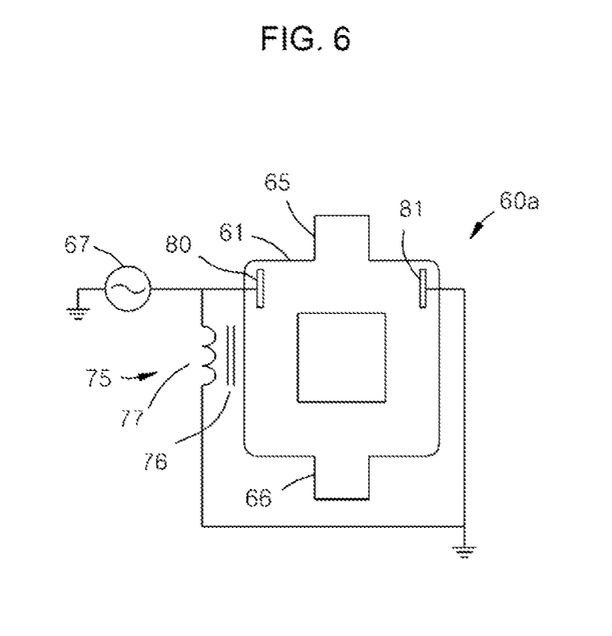
FIGS. 6 to 9 are diagrams exemplarily illustrating various types of remote plasma generators which may be adopted in the remote plasma system of the present invention.
Figure 7:
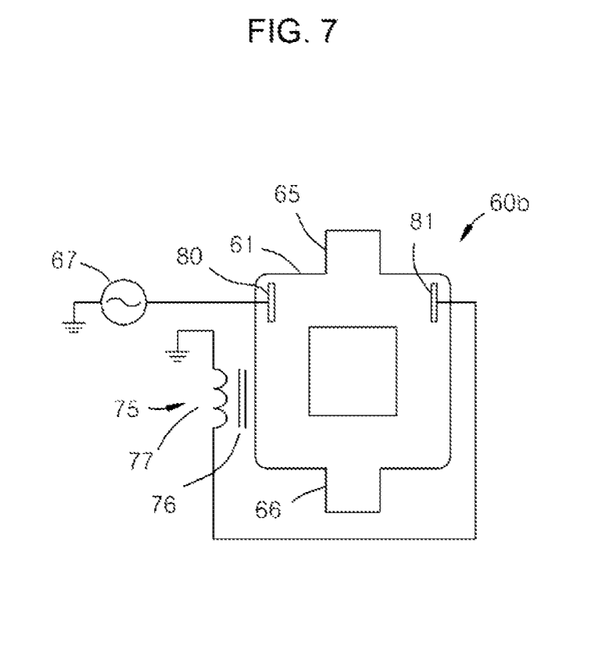

Referring to FIGS. 6 and 7, a magnetic core 76 and a transformer 75 having a primary wire 77 wound thereto are mounted on remote plasma generators 60a and 60b, which may be adopted in the remote plasma system of the present invention, so as to supply the electromotive force for forming plasma in the plasma discharge space of the generator body 61. In addition, Remote plasma generators 60a and 60b may further include capacitively coupled electrodes 80 and 81 that are installed in the generator body 61 so as to supply the electromotive force for forming plasma to the plasma discharge space of the generator body 61 and operates by receiving driving power from the power supply source 67. The primary wire 77 and the capacitively coupled, electrodes 80 and 81 may be connected to the power supply source 67 in parallel (an example illustrated in FIG. 6) or in series (an example illustrated in FIG. 7).

Figure 8:
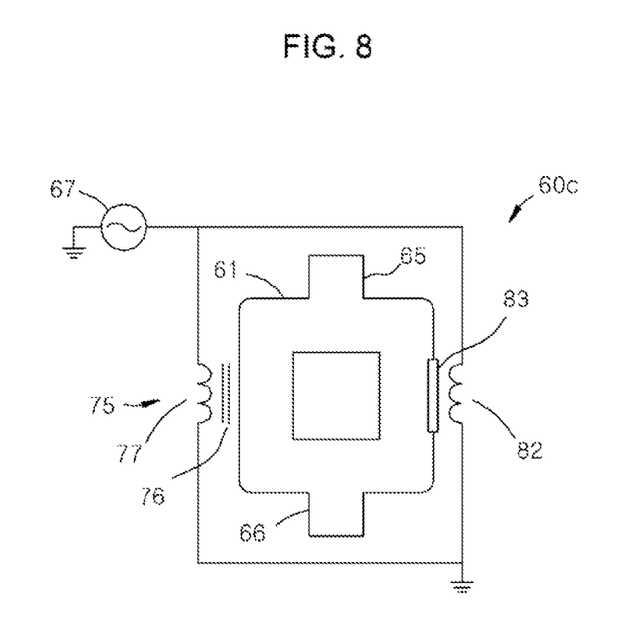
Figure 9:
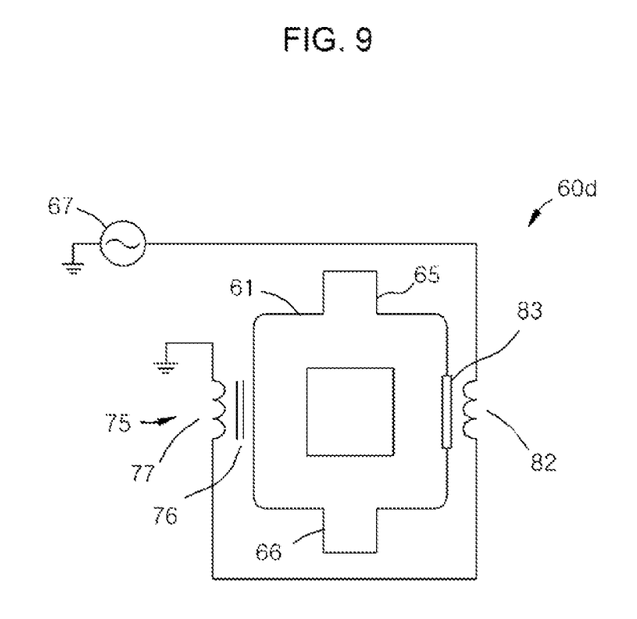

Referring to FIGS. 8 and 9, the magnetic core 76 and the transformer 75 having the primary wire 77 wound thereto are mounted on other remote plasma generators 60c and 60d, which may be adopted in the remote plasma system of the present invention, so as to supply the electromotive force for forming plasma in the plasma discharge space of the generator body 61. In addition, the remote plasma generators 60c and 60d may further include an induction antenna coil 82 that is installed in the generator body 61 so as to supply the electromotive force for forming plasma to the plasma discharge space of the generator body 61 and operates by receiving driving power from the power supply source 67. A dielectric window 83 may be installed so as to induce the electromotive force into a part in which the induction antenna coil 82 is installed. The primary wire 77 and the induction antenna coil 82 may be connected to the power supply source 67 in parallel (an example illustrated in FIG. 8) or in series (an example illustrated in FIG. 9).

As illustrated in FIGS. 6 to 9, in the remote plasma generators 60a, 60b, 60c, and 60d adopted in the remote plasma system of the present invention, a plasma source of a hybrid type may be used in which capacitively coupled plasma or inductively coupled plasma is mixed in addition to a transformer coupled plasma type. When the hybrid type plasma source is adopted, remote plasma may be more stably generated. However, any one type among various types of remote plasma, generation types such as, for example, the transformer coupled plasma, the coactively coupled plasma, the inductively coupled plasma, and microwave plasma may be applied a.

The foregoing exemplary embodiments of the remote plasma system having the self management function and the self management method of the same according to the present invention are illustrative only, and those skilled in the art will understand that various modification and other equivalent exemplary embodiments can be made therefrom. Therefore, it can be fully appreciated that the present invention is not limited to only the form mentioned in the detailed description. Accordingly, the true technical protection scope of the present invention should be defined by the technical spirit of the appended claims. Further, it should be appreciated that the present invention includes all modifications and equivalents, and substitutions within the spirit and the scope of the present invention defined by the appended claims.

What is claimed is:

1. A remote plasma system having a self management function, the remote plasma system comprising:
   a remote plasma generator for generating plasma and remotely supplying the generated plasma to a process chamber;
   a sensor unit including:
      one or more voltage measurement sensors for measuring voltage induced to a generator body of the remote plasma generator, and
      a plasma measurement sensor for measuring exhaust gas from the process chamber and generating a plasma measurement value corresponding to a measured state of the exhaust gas; and
   a control unit for generating operating state information of the remote plasma generator based on the measured voltage and for generating process progress state information associated with the process chamber based on the plasma measurement value corresponding to a measured state of the exhaust gas.

2. The remote plasma system of claim 1, wherein
   the sensor unit further includes:
   one or more current measurement sensors for measuring current that leaks through the generator body of the remote plasma generator to obtain a leakage current measurement value, and
   wherein the control unit is to generate another operating state information based on the leakage current measurement value.

3. The remote plasma system of claim 1, wherein
   the sensor unit further includes:
   a current transformer installed around a gas outlet of the remote plasma generator to measure an electrical current of the generator body, and
   wherein the control unit is to generate another operating state information based on the measured electrical current of the generator body.

4. The remote plasma system of claim 1, wherein
   the sensor unit further includes:
   a plasma measurement sensor for measuring plasma generated in the generator body of the remote plasma generator and for generating a plasma measurement value corresponding to a measured state of plasma in the generator body, and
   wherein the control unit is to generate another operating state information of the remote plasma generator based on the plasma measurement value corresponding to a measured state of plasma in the generator body.

5. The remote plasma system of claim 1, wherein
   the sensor unit further includes:
   a plasma measurement sensor for measuring a state of plasma that flows into the process chamber and for generating a plasma measurement value corresponding to a measured state of plasma that flows into the process chamber, and
   wherein the control unit is to generate process progress state information in the process chamber based on the plasma measurement value corresponding to a measured state of plasma that flows into the process chamber.

6. The remote plasma system of claim 1, wherein
   generator body includes a plasma discharge space;
   the remote plasma system of claim 1, further comprising:
      a transformer having a magnetic core and a primary wire wound to the magnetic core that are installed in the generator body so as to supply electromotive force for forming plasma in the plasma discharge space of the generator body; and
      a power supply to supply driving power to the primary wire of the transformer.

7. The remote plasma system of claim 6, further comprising:
   a capacitively coupled electrode connected to the power supply and installed in the generator body so as to supply the electromotive force for forming the plasma in the plasma discharge space of the generator body.

8. The remote plasma system of claim 6, further comprising:
   an induction antenna coil connected to the power supply and installed in the generator body so as to supply the electromotive force for forming the plasma to the plasma discharge space of the generator body.

9. The remote plasma system of claim 1, wherein
the generator body is metallic and includes two or more divided regions divided into one or more insulation sections, and
the one or more voltage measurement sensors include two or more voltage measurement sensors installed in each of the two or more divided regions of the generator body.

10. The remote plasma system of claim 2, wherein
the generator body is metallic and includes a plasma discharge space and two or more divided regions divided into one or more insulation sections, and
the one or more current measurement sensors include two or more current measurement sensors installed in the two or more divided regions of the generator body.

11. A self management method of a remote plasma system, the method comprising:
starting an operation of a remote plasma generator including a generator body and a process chamber in communication with the generator body;
measuring, via one or more voltage measurement sensors of a sensor unit, a voltage induced in the generator body;
measuring, via a plasma measurement sensor of the sensor unit, exhaust gas from the process chamber;
generating a plasma measurement value corresponding to a measured state of the exhaust gas;
generating operating state information of the remote plasma generator based on the measured voltage; and
generating process progress state information in the process chamber based on the plasma measurement value the plasma measurement value corresponding to a measured state of the exhaust gas.

12. The self management method of claim 11, further comprising:
measuring, via a current measurement sensor of the sensor unit, current that leaks through the generator body of the remote plasma generator to obtain a leakage current measurement value; and
generating another operating state information based on the leakage current measurement value.

13. The self management method of claim 11,
wherein the sensor unit further includes a current transformer installed around a gas outlet of the remote plasma generator, the method further comprising:
measuring, via the current transformer, an electrical current of the generator body; and
generating another operating state information based on the measured electrical current of the generator body.

14. The self management method of claim 11, further comprising:
measuring, via a plasma measurement sensor, plasma generated in the generator body of the remote plasma generator;
obtaining a plasma measurement value corresponding to a measured state of the plasma in the generator body; and
generating another operating state information based on the plasma measurement value corresponding to a measured state of the plasma in the generator body.

15. The self management method of claim 11, further comprising:
measuring, via a plasma measurement sensor, a state of plasma that flows into the process chamber;
generating a plasma measurement value corresponding to a measured state of the plasma that flows into the process chamber, and
generating process progress state information associated with the process chamber based on the plasma measurement corresponding to a measured state of the plasma that flows into the process chamber.

* * * * *